United States Patent [19]

Morgan et al.

[11] 4,406,826
[45] Sep. 27, 1983

[54] HEAT CURABLE CONDUCTIVE INK

[75] Inventors: Charles R. Morgan, Brookeville; Arthur D. Ketley, Chevy Chase, both of Md.

[73] Assignee: W. R. Grace & Co., New York, N.Y.

[21] Appl. No.: 241,144

[22] Filed: Mar. 5, 1981

[51] Int. Cl.³ .......................... H01B 1/02; B05D 3/06
[52] U.S. Cl. ..................................... 252/512; 252/502; 252/513; 252/514; 427/96; 427/125; 524/780; 524/781; 524/783; 524/785; 524/786; 524/789; 524/854; 524/871; 524/875; 524/876; 524/878; 524/881; 523/223; 526/75; 526/261; 526/301; 526/312
[58] Field of Search ............... 260/42.14, 42.52, 42.22; 252/502, 513, 514, 500, 511; 523/223; 524/780, 754, 781, 783, 785, 786, 789, 878, 881, 854

[56] References Cited

U.S. PATENT DOCUMENTS

| Re. 30,274 | 5/1980 | Bolon | 431/359 |
|---|---|---|---|
| 3,412,043 | 11/1968 | Gilliland | 260/37 EP |
| 3,662,023 | 5/1972 | Kehr et al. | 525/426 |
| 3,694,241 | 9/1972 | Guthrie et al. | 260/42.21 |
| 3,704,125 | 11/1972 | Ketley et al. | 430/15 |
| 3,746,622 | 7/1973 | Nishikawa et al. | 260/17.3 |
| 3,904,499 | 9/1975 | Morgan | 204/159.15 |
| 3,968,056 | 7/1976 | Bolon et al. | 204/159.24 |
| 3,989,644 | 11/1976 | Bolon et al. | 204/42.22 |
| 4,008,341 | 2/1977 | Kehr et al. | 204/159.22 |
| 4,018,940 | 4/1977 | Morgan | 204/159.14 |
| 4,054,714 | 10/1977 | Mastrangelo | 428/403 |
| 4,120,721 | 10/1978 | Ketley et al. | 204/159.22 |
| 4,125,644 | 11/1978 | Ketley et al. | 427/36 |
| 4,208,888 | 7/1981 | Bush et al. | 526/312 |
| 4,224,023 | 9/1980 | Cheung | 260/998.11 |

FOREIGN PATENT DOCUMENTS 2040977 9/1980 United Kingdom .

OTHER PUBLICATIONS

Derwent Abst. 59032 B/32, (J54081538), 6-29-79, NHK Spring KK.
Derwent Abst. 44822 Y/25, (SU536952), 12-9-76, Moscow Mendeleev.
Derwent Abst. 12321 Y/07, (SU517616), 6-25-76, Mikhailova I.I.
Chem. Abst. 82 (1975), 44547f, Iwakichi et al., "Anaerobic Polymerizable Adhesive Comp.".
Chem. Abs. 74-14317t, (1974), "Anaerobic Adhesive Comp. . . . ", Iwakichi et al.
Swisher et al., "Polymer Coated Metal & Alloy Particles for Magnetic Recording," IEEE Trans., vol. 7, #1, Mar. 1971, pp. 155-158.

Primary Examiner—Melvyn I. Marquis
Assistant Examiner—Herbert J. Lilling
Attorney, Agent, or Firm—Richard P. Plunkett; William W. McDowell, Jr.

[57] ABSTRACT

This invention relates to a heat curing process and to a solventless screen printable, heat curable conductive ink composition comprising
(1) an ethylenically unsaturated member of the group consisting of
  (a) a liquid, ethylenically, unsaturated monomer, oligomer or prepolymer of the formula:

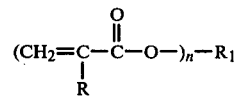

wherein R is H or CH₃, R₁ is an organic moiety and n is at least 2,
  (b) a polythiol in combination with (a) supra,
  (c) a polythiol in combination with a liquid ethylenically unsaturated monomer, oligomer or prepolymer of the formula:

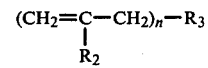

wherein $R_2$ is H or $CH_3$, $R_3$ is an organic moiety and n is at least 2, and
  (d) mixtures of (a), (b) and (c),
(2) a thermal initiator, and
(3) an electrically conductive material.

Heating of the composition in a desired pattern on a substrate results in a printed electric circuit.

6 Claims, No Drawings

HEAT CURABLE CONDUCTIVE INK

BACKGROUND OF THE INVENTION

1. Field of the Invention

This invention relates to a solventless, screen printable, heat curable, conductive ink composition.

The invention also relates to a process for forming resistors or conductors on substrates to form circuitboards and electronic membrane keyboards.

In order to obtain a commercially viable, solventless, screen printable, heat curable conductive ink, several parameters have to be met, to wit:

(1) The ink must be screen printable, i.e., have the right viscosity and other rheological properties such as thixotropy.

(2) The ink, when cured, must adhere well to the substrate.

(3) The cured conductive ink must have sufficient flexibility for use on flexible substrates such as Mylar.

(4) The cured ink must conduct electrically.

(5) The ink should be fast curing, i.e., in less than 30 minutes.

(6) The ink should also cure at low temperatures, i.e., below about 200° C., since above said temperature many of the substrates are distorted.

(7) The conductive ink composition should have a good shelf life.

2. Description of the Prior Art

Conductive coatings are known in the art.

U.S. Pat. No. 3,412,043 teaches an electrically conductive resinous composition consisting essentially of silver flake, resinous binder and finally divided inert filler in specified weight ratios. Therein one resinous binder is an epoxy resin system which is cured by the addition of an amine curing agent at slightly elevated temperatures.

U.S. Pat. No. 3,746,662 teaches electrically conductive coatings comprising certain epoxy resins, particles of tough polymer having carboxy, hydroxy, amino or isocyanate substituents which cocure with the epoxy resin, finely divided metal particles and a curing agent for the epoxy resin. The curing is obtained by heating the composition at temperatures of 125° C. or higher.

U.S. Pat. No. 3,968,056 teaches a radiation curable ink comprising a particulated electrically conductive metal containing material in combination with an organic resin binder which is converted to a conductive coating on the surface of a substrate by exposure to either actinic or ionizing radiation.

Re No. 30,274 teaches a circuit board for activating high voltage flashlamps, said board including a nonconductive, thermoplastic substrate having a patterned electrically conductive coating on one of its surfaces and defining electrical circuitry for the flashlamps, said coating comprising an organic resin matrix curable by UV radiation and a particulated electrically conductive material selected from the group consisting of a particulated electrically conductive metal and a particulated electrically conductive metal containing material, including mixtures thereof with no more than up to about 15% by weight of said particulated electrically conductive material having an aspect ratio of diameter to thickness of a value greater than 20.

It is also known from U.S. Pat. No. 4,020,233 to form cured polythioesters by admixing a composition comprising an ethylenically unsaturated compound containing at least two unsaturated carbon-to-carbon bonds per molecule, a polythiol containing at least two thiol groups per molecule, a photoinitiator and a catalytic amount of a pinacol and, thereafter, subjecting the admixture to UV radiation and heat.

It is further known from U.S. Pat. No. 3,662,023 to form a cured polythioether from a composition consisting essentially of an allylic terminated polyene, a polythiol and a chemical free radical generating agent such as an organic peroxide.

Additionally, from U.S. Pat. No. 4,008,341, it is known to form a cured polythioether from a composition curable in the presence of a free radical generating agent, e.g., a peroxide comprising an acrylate terminated polyene and a polythiol.

OBJECTS OF THE INVENTION

One object of the instant invention is to produce a conductive ink which is solventless. Another object of the invention is to produce a conductive ink which is screen printable. Yet another object of the invention is to produce a condutive ink which is heat curable. Still another object of the invention is to produce a process whereby a conductive composition can be formed on a substrate using screen printing. Other objects will become apparent from a reading hereinafter.

DESCRIPTION OF THE INVENTION

The present invention relates to a solventless, screen printable, heat curable conductive ink composition comprising (1) an ethylenically unsaturated member of the group consisting of
  (a) a liquid, ethylenically, unsaturated monomer, oligomer or prepolymer of the formula:

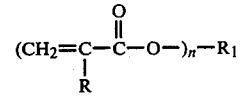

wherein R is H or $CH_3$, $R_1$ is an organic moiety and n is at least 2,
  (b) a polythiol in combination with (a) supra,
  (c) a polythiol in combination with a liquid ethylenically unsaturated monomer, oligomer or prepolymer of the formula:

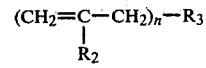

wherein $R_2$ is H or $CH_3$, $R_3$ is an organic moiety and n is at least 2, and
  (d) mixtures of (a), (b) and (c), (2) a thermal initiator, and (3) an electrically conductive material.

The invention also relates to a process for forming an electrically conductive circuit on a substrate which comprises screen printing in a desired pattern, the aforesaid conductive ink composition onto a substrate and, thereafter, exposing said printed substrate to heat for a time sufficient to form a cured conductive ink pattern on said substrate.

The electrically conductive material herein can be in the form of particles, spheres, beads, powder, fibers, flakes or mixtures thereof. By "electrically conductive material", as used herein, is meant the electrically conductive material, per se, not including any substrate on which it may be coated. Aside from the noble metals and noble metal coated substrates which can be used as the electrically conductive material herein, the use of other metals such as copper, aluminum, iron, nickel and zinc are also contemplated. Also employable are silver coated glass spheres sometimes referred to as "beads" which have an average diameter of about 6 to 125 microns. These materials are made from glass spheres commonly employed as reflective filler materials and are commercially available. Additionally, glass fibers coated with silver, copper or nickel as shown in French Patent No. 1,531,272 can also be employed. Electrically conductive material used herein also includes carbon black and graphite.

In the instant process the amount of the electrically conductive material needed for conductance is in the range 6 to 97 weight % of the conductive ink composition employed, preferably 65 to 85 weight % on the same basis. Operable cured ink thicknesses herein can range from about 0.05 to 20 mils or more with the preferred range being 0.5 to 5 mils.

The electrically conductive material employed herein can be used in various sizes depending on its form. For best results, the major dimension of the electrically conductive material should be no greater than about 75 microns. Preferably, the electrically conductive material has a major dimension in the range 10 to 60 microns.

The solventless, curable, reactive liquid organic resins used herein to act as a matrix for the electrically conductive material include, but are not limited to, at least one ethylenically unsaturated polyene member of the group consisting of (a) a liquid, ethylenically, unsaturated monomer, oligomer or prepolymer of the formula:

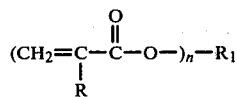

wherein R is H or CH$_3$, R$_1$ is an organic moiety and n is 2 to 4, either per se or in combination with, a polythiol, (b) a polythiol in combination with a liquid ethylenically unsaturated monomer, oligomer or prepolymer of the formula:

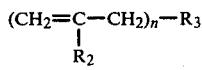

wherein R$_2$ is H or CH$_3$, R$_3$ is an organic moiety and n is at least 2, and (c) mixtures of (a) and (b).

Although the aforesaid organic resin compositions, per se, are operable herein to form matrixes, they may also be used in combination with conventional copolymerizable monomeric compounds or reactive diluents. The admixture of the composition of the instant invention with other monomers is employed usually to control viscosity and other application variables such as rate of cure as well as final film or coating properties such as hardness and flexibility. These reactive diluents along with the ethylenically unsaturated group member on exposure to heat react to form copolymers with each other or with the polythiol to form polythioethers. Examples of conventional copolymerizable compounds useful as reactive diluents include, but are not limited to, mono- and polyfunctional acrylic esters, e.g., hexanediol diacrylate, trimethylolpropane triacrylate, mono- and polyfunctional methacrylic esters, e.g., ethoxylated Bisphenol A dimethacrylate, styrene, vinyl-toluene, acrylonitrile, methacrylonitrile, vinyl acetate, vinyl pyrrolidone, vinyl chloride, vinylidene chloride, butadiene, isoprene, chloroprene, divinyl benzene, di(vinylphenyl) carbonate, diallyl phthalate, diallyl carbonate, allyl acetate, diethylene glycol diallyl ether, di-(allylphenyl) carbonate, diallyl furmarate, triallyl isocyanurate, triallyl cyanurate, diallyl chlorendate, diallyl maleate and unsaturated polyesters and mixtures thereof. By the term unsaturated polyesters herein is meant the usual polycondensation products which consist of ester-like linked residues of polyvalent, especially divalent, alcohols, as well as possibly also residues of monovalent alcohols and/or of monovalent carboxylic acids, whereby the residues must contain at least partially unsaturated groups. Examples of acids include maleic acid, fumaric acid, itaconic acid, mesaconic acid, citraconic acid, succinic acid, glutaric acid, adipic acid, phthalic acid, tetrachlorophthalic acid, hexachloroendomethylenetetrahydrophthalic acid, trimellitic acid, benzoic acid, linseed oil fatty acid and ricinoleic fatty acid and mixtures thereof. Examples of alcohols include ethylene glycol, diethylene glycol, propane, butane and hexane diols, trimethylolpropane, pentaerythritol, butanol and tetrahydrofurfuryl alcohol.

The reactive diluents can be added to the system in amounts ranging up to 90% by weight of the organic resin, preferably 10 to 50% by weight of the same basis.

The thermal initiators used herein are selected from substituted or unsubstituted pinacols, azo compounds and organic peroxides.

The organic peroxides operable are of the general formula:

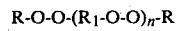

wherein n=0 or 1, R is independently selected from hydrogen, aryl, alkyl, aryl carbonyl, alkaryl carbonyl, aralkyl carbonyl and alkyl carbonyl and R$_1$ is alkyl or aryl, said alkyl groups containing 1 to 20 carbon atoms.

Examples of operable organic peroxides include, but are not limited to 2,5-dimethyl-2,5-di(t-butylperoxy)-hexane, 1,3-bis(t-butylperoxyisopropyl)benzene, 1,3-bis-(cumylperoxyisopropyl)benzene, 2,4-dichlorobenzoyl peroxide, caprylyl peroxide, lauroyl peroxide, t-butyl peroxyisobutyrate, benzoyl peroxide, p-chlorobenzoyl peroxide, hydroxyheptyl peroxide, di-t-butyl diperphthalate, t-butyl peracetate, t-butyl perbenzoate, dicumyl peroxide, 1,1-di(t-butylperoxy)-3,3,5-trimethylcyclohexane and di-t-butyl peroxide.

The organic peroxide is added to the composition in an amount ranging from 0.01–10%, preferably 0.1–5%, by weight based on the weight of the ethylenically unsaturated group member.

Examples of azo compounds operable herein include, but are not limited to, commercially available compounds such as 2-t-butylazo-2-cyanopropane; 2,2'-azobis(2,4-dimethyl-4-methoxyvaleronitrile); 2,2'-azobis(isobutyronitrile); 2,2'-azobis(2,4-dimethylvaleronitrile) and 1,1'-azobis(cyclohexanecarbonitrile).

The azo compound is added to the composition in an amount ranging from 0.001–5%, preferably 0.01–2% by weight based on the weight of the ethylenically unsaturated group member.

The substituted or unsubstituted pinacols operable herein as a thermal initiator have the general formula:

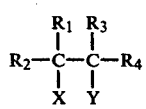

wherein $R_1$ and $R_3$ are the same or different substituted or unsubstituted aromatic radicals, $R_2$ and $R_4$ are substituted or unsubstituted aliphatic or aromatic radicals and X and Y which may be the same or different are hydroxyl, alkoxy or aryloxy.

Preferred pinacols are those wherein $R_1$, $R_2$, $R_3$ and $R_4$ are aromatic radicals, especially phenyl radical and X and Y are hydroxyl.

Examples of this class of compounds include, but are not limited to, benzopinacol, 4,4'-dichlorobenzopinacol, 4,4'-dibromobenzopinacol, 4,4'-diiodobenzopinacol, 4,4',4'',4'''-tetrachlorobenzopinacol, 2,4-2',4'-tetrachlorobenzopinacol, 4,4'-dimethylbenzopinacol, 3,3'-dimethylbenzopinacol, 2,2'-dimethylbenzopinacol, 3,4-3',4'-tetramethylbenzopinacol, 4,4'-dimethoxybenzopinacol, 4,4',4'',4'''-tetramethoxybenzopinacol, 4,4'-diphenylbenzopinacol, 4,4'-dichloro-4'',4'''-dimethylbenzopinacol, 4,4'-dimethyl-4'',4'''-diphenylbenzopinacol, xanthonpinacol, fluorenonepinacol, acetophenonepinacol, 4,4'-dimethylacetophenone-pinacol, 4,4'-dichloroacetophenonepinacol, 1,1,2-triphenyl-propane-1,2-diol, 1,2,3,4-tetraphenylbutane-2,3-diol, 1,2-diphenylcyclobutane-1,2-diol, propiophenone-pinacol, 4,4'-dimethylpropiophenonepinacol, 2,2'-ethyl-3,3'-dimethoxypropiophenone-pinacol, 1,1,1,4,4,4-hexafluoro-2,3-diphenyl-butane-2,3-diol.

As further compounds according to the present invention, there may be mentioned: benzopinacol-mono methylether, benzopinacol-mono-phenylether, benzopinacol and monoisopropyl ether, benzopinacol monoisobutyl ether, benzopinacol mono (diethoxy methyl) ether and the like.

The pinacol is added to the composition in amounts ranging from 0.01–10%, preferably 0.1–5%, by weight based on the weight of the organic resin and polythiol.

The thermal initiator can be added to the system in various ways. That is, the thermal initiator, per se, can be admixed with the organic resin. Additionally, it can be admixed with the polythiol and added to the organic resin. Furthermore, the thermal initiator can be dissolved or suspended in the reactive diluent or in well known commercially available solvents such as dibutyl phthalate; ketones, e.g., acetone and methylethyl ketone or chlorinated hydrocarbons such as methylene chloride, and then added to the system.

In practicing the instant invention it is sometimes necessary to add a polythiol to the composition prior to curing. This is especially true when the ethylenic unsaturation in the organic resin (sometimes hereinafter referred to as a polyene) is an allylic group. In this case, during the curing step, the polythiol adds across the double bond of the allylic group resulting in solid cured materials in a commercially acceptable time period. In the instance where the ethylenic unsaturation in the polyene is an acrylic or methacrylic group, the addition of a polythiol to the system, although not necessary, results in a fully cured resin and precludes the occurrence of a tacky surface due to air inhibition of the curing.

As used herein, the term polythiols refers to simple or complex organic compounds having a multiplicity of pendant or terminally positioned —SH functional groups per average molecule.

On the average the polythiols must contain 2 or more —SH groups/molecule and usually have a viscosity range of slightly above 0 to 20 million centipoises (cps) at 70° C., as measured by a Brookfield Viscometer. Included in the term "polythiols" as used herein are those materials which in the presence of an inert solvent, aqueous dispersion or plasticizer fall within the viscosity range set out above at 70° C. Operable polythiols in the instant invention usually have molecular weights in the range 94–20,000, preferably 100–10,000.

The polythiols operable in the instant invention can be exemplified by the general formula: $R_8$—$(SH)_n$ where n is at least 2 and $R_8$ is a polyvalent organic moiety free from reactive carbon-to-carbon unsaturation. Thus, $R_8$ may contain cyclic groupings and minor amounts of hetero atoms such as N, S, P or O but primarily contains carbon-hydrogen, carbon-oxygen or silicon-oxygen containing chain linkages free of any reactive carbon-to-carbon unsaturation.

One class of polythiols operable with polyenes in the instant invention to obtain essentially odorless polythioether products are esters of thiol-containing acids of the general formula HS—$R_9$—COOH, where $R_9$ is an organic moiety containing no "reactive" carbon-to-carbon unsaturation, with polyhydroxy compounds of the general structure $R_{10}$—$(OH)_n$, where $R_{10}$ is an organic moiety containing no "reactive" carbon-to-carbon unsaturation and n is 2 or greater. These components will react under suitable conditions to give a polythiol having the general structure

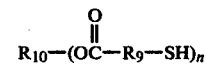

wherein $R_9$ and $R_{10}$ are organic moieties containing no "reactive" carbon-to-carbon unsaturation and n is 2 or greater.

Certain polythiols such as the aliphatic monomeric polythiols (ethane dithiol, hexamethylene dithiol, decamethylene dithiol, tolylene-2,4-dithiol, etc.) and some polymeric polythiols such as a thiol-terminated ethylcyclohexyl dimercaptan polymer, etc., and similar polythiols which are conveniently and ordinarily synthesized on a commercial basis, although having obnoxious odors, are operable in this invention but many of the end products are not widely accepted from a practical, commercial point of view. Examples of the polythiol compounds preferred for this invention because of their relatively low odor level include, but are not limited to, esters of thioglycolic acid (HS—$CH_2COOH$), alpha-mercaptopropionic acid (HS—$CH(CH_3)$—COOH) and β-mercaptopropionic acid (HS—$CH_2CH_2COCH$) with polyhydroxy compounds such as glycols, triols, tetraols, pentaols, hexaols, etc. Specific examples of the preferred polythiols include, but are not limited to, ethylene glycol bis (thioglycolate), ethylene glycol bis-(β-mercaptopropionate), trimethylolpropane tris(thioglycolate), trimethylolpropane tris(β-mercaptopropionate), pentaerythritol tetrakis(thioglycolate) and pentaerythritol tetrakis(β-mercaptopropionate), all of which are commercially available. A specific example of a referred polymeric polythiol is polypropylene ether glycol bis(β-mercaptopropionate) which is prepared from polypropylene ether glycol (e.g., Pluracol P2010, Wyandotte Chemical Corp.) and beta-mercaptopropionic acid by esterification.

Additionally, polythiols operable herein to give cured solid polythioether products with the polyene on heating in the presence of a thermal initiator include the mercaptoester derivatives of styrene-allyl alcohol copolymers set out in U.S. Pat. No. 3,904,499 and the isocyanurate containing polythiols disclosed in U.S. Pat. No. 3,676,440 and liquid thiol-terminated polymers made in accord with U.S. Pat. No. 3,258,495, all incorporated hereby by reference. An example of the aforesaid latter type liquid thiol-terminated polymer is CAPCURE 3-800, commercially available from Diamond Shamrock Chemical Company.

The preferred polythiol compounds are characterized by a low level of mercaptan-like odor initially and, after reaction, give essentially odorless polythioether end products which are useful matrixes for electrically conductive material.

In the case of a polythiol in combination with allylic polyenes the mole ratio of thiol/ene groups for preparing the curable composition is from 0.2/1 to about 2/1 and desirably about 0.75/1 to about 1.5/1 group ratio.

In the case of a polythiol in combination with acrylic components the mole ratio of thiol/ene groups for preparing the curable composition is from 0.01/1 to about 1/1 and desirably about 0.02/1 to about 0.5/1 group ratio.

Prior to curing, the polyene and polythiol components are admixed in a suitable manner so as to form a homogeneous liquid curable mixture. Thus, the polyene and polythiol reactants can be admixed without the necessity of using a solvent at room temperature or slightly elevated temperatures up to about 40° C. when one of the components is a solid or, if desired, the reactants may be dissolved in a suitable solvent and, thereafter, prior to curing, the solvent can be removed by suitable means such as evaporation.

It should be understood that in order to obtain the maximum strength, solvent resistance, creep resistance, heat resistance and freedom from tackiness, the reaction components consisting of the polyenes and polythiols of this invention are formulated in such a manner as to give solid, crosslinked, three dimensional network polythioether polymer systems on curing. In order to achieve such infinite network formation, the individual polyenes and polythiols must have a functionality of at least two and the sum of the functionalities of the polyene and polythiol components must always be greater than four. Blends and mixtures of the polyenes and the polythiols containing said functionality are also operable herein. The compositions of the present invention may, if desired, include such additives as antioxidants, inhibitors, fillers, antistatic agents, flame-retardant agents, thickeners, thixotropic agents, surface-active agents, viscosity modifiers, plasticizers, tackifiers and the like within the scope of this invention. Such additives are usually preblended with the ethylenically unsaturated compound prior to or during the compounding step. Operable fillers which can be added to the system to cut cost include natural and synthetic resins, glass fibers, wood flour, clay, silica, alumina, carbonates, oxides, hydroxides, silicates, glass flakes, borates, phosphates, diatomaceous earth, talc, kaolin, barium sulfate, calcium sulfate, calcium carbonate and the like. The aforesaid additives may be present in quantities up to 500 parts or more per 100 parts of the organic resin by weight and preferably about 0.005 to about 300 parts on the same basis.

Additionally, conventional UV stabilizers, scavengers and antioxidants such as hydroquinone, pyragallol, phosphorous acid, triphenyl phosphine, tert-butyl hydroquinone, tert-butyl catechol, p-benzoquinone, 2,5-diphenylbenzo-quinone, 2,6-di-tert-butyl-p-cresol, etc., are added to the system in conventional amounts ranging from 0.001 to 2.0% by weight of the organic resin.

The heating step using a thermal initiator to cure the organic resin containing the electrically conductive material is usually carried out for a period of 1 to 30 minutes at a temperature of 80°–200° C., preferably 110°–170° C. which is sufficient to fully cure the composition to a solid product.

The following examples are set out to explain, but expressly not limit, the instant invention. Unless otherwise noted, all parts and percentages are by weight.

EXAMPLE 1

To a 5 liter round bottom flask equipped with stirrer, thermometer, Graham (coil) condenser and dropping funnel was charged 1,164 g of redistilled, commercially available diallylamine. The flask was flushed with nitrogen and kept under a nitrogen blanket during the reaction. The flask was heated to 80° C. with stirring and 1,940 g of a Bisphenol A diglycidyl ether type epoxy resin, commercially available from Shell Chemical Co. under the tradename "EPON 828", was slowly added to the flask by means of the dropping funnel over a 2 hour period while the flask was maintained at a temperature of 80°–90° C. After the addition was complete, stirring and heating at 80°–90° C. were continued for 4 hours. The excess diallylamine (194 g) was vacuum-stripped at 90° C. and 1–10 mm Hg. The epoxy tetra-ene product, i.e.,

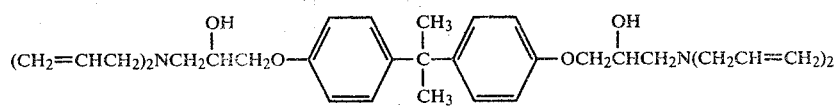

obtained amounted to 2,910 g and will be referred to hereinafter as Prepolymer A.

EXAMPLE 2

To a mixture of 30.035 parts of methylene-bis(cyclohexylisocyanate) containing 0.028 parts of stannous octoate and 0.506 parts of triphenyl phosphite was added 15.321 parts of hydroxypropyl acrylate. After 2 hours at 50° C., 0.020 parts of hydroquinone monomethyl ether, 0.027 parts of stannous octoate and 24.50 parts of hexanediol diacrylate were added, followed by 29.562 parts of Pluracol TP-740 (a triol of MW 730 made by reacting trimethylolpropane with propylene oxide). After 1 hour at 80° C. the isocyanate content had reached 0. The resulting reaction product contains approximately 75% of a urethane triacrylate oligomer, i.e.,

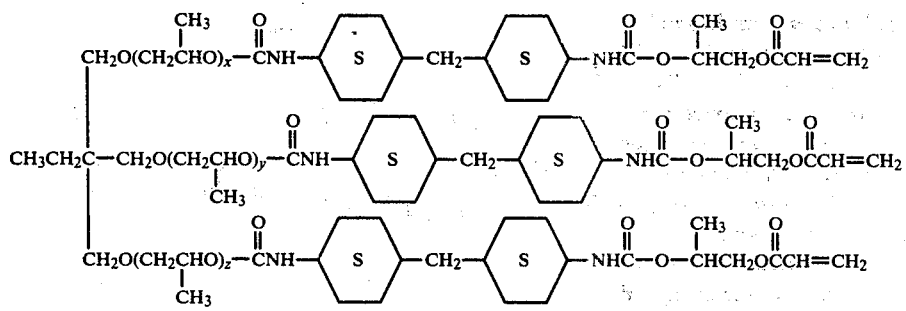

$$\frac{x+y+z}{3} = 3 \text{ to } 4 \text{ and}$$

25% of hexanediol diacrylate, and will be known as Prepolymer B.

EXAMPLE 3

A heat curable organic resin composition was prepared by mixing the following components:

| Components | Parts by Weight |
| --- | --- |
| Prepolymer A from Example 1 | 13.25 |
| Triallyl cyanurate | 6.57 |
| Diallyl phthalate | 19.03 |
| Ethylene glycol dimethacrylate | 4.595 |
| Pentaerythritol tetrakis($\beta$-mercapto-propionate) | 7.536 |
| 1,3-bis(2-hydroxyethyl)-5,5-dimethyl-hydantoin bis(3-mercaptopropionate) | 27.92 |
| FC-430 (wetting agent - 3M Corp.) | 0.083 |
| Benzopinacol | 0.91 |
| Stabilizers | |
| Pyrogallol | 0.03 |
| Phosphorous acid | 0.008 |
| Triphenylphosphine | 0.067 |

The above formulation will be referred to hereinafter as heat curable Composition A.

EXAMPLE 4

27 parts by weight of heat curable Composition A from Example 3 was admixed with 73 parts by weight of silver powder, commercially available from Handy & Harmon under the tradename "Silpowder-130". The silver powder was subjected to a screening in order to obtain minus 325 mesh powder for use in this example.

The admixture was screen printed in a line circuit pattern onto a Mylar substrate through a 165 mesh stainless steel screen. The coated substrate was cured for 10 minutes at 160° C. in an air oven. The resultant cured circuit had a resistivity of $8.38 \times 10^{-4}$ ohm-cm.

EXAMPLE 5

Example 4 was repeated except that the formulation consisted of 39 parts by weight of heat curable Composition A, 60 parts by weight of "Silpowder-130" and ten parts by weight of "ketjenblack EC", a carbon black commercially available from Armak Co. After heat curing for 10 minutes in an air oven at 160° C. the circuit had a resistivity of 0.046 ohm-cm.

EXAMPLE 6

A heat curable, organic resin composition was prepared by mixing the following components:

| Components | Parts by Weight |
| --- | --- |
| Prepolymer A from Example 1 | 79.144 |
| Triallyl cyanurate | 39.234 |
| Pentaerythritol tetrakis($\beta$-mercapto-propionate) | 79.144 |
| Benzopinacol | 2.0 |
| FC-430 (wetting agent - 3M Corp.) | 0.204 |
| Stabilizers | |
| Pyrogallol | 0.086 |
| Phosphorous acid | 0.018 |
| Triphenylphosphine | 0.168 |

The above formulation will be referred to hereinafter as heat curable Composition B.

EXAMPLE 7

23 parts by weight of heat curable Composition B from Example 6 were admixed with 77 parts by weight of Type 123 nickel powder, commercially available from INCO Nickel. The admixture was screen printed in a line circuit pattern through a 165 mesh stainless steel screen onto a Mylar substrate. After heat curing in an air oven at 160° C. for 10 minutes the circuit had a resistivity of 0.014 ohm-cm.

EXAMPE 8

24 parts by weight of Prepolymer B from Example 2 were admixed with 76 parts by weight of silver powder sold under the tradename "Silpowder-130" by Handy & Harmon. Prior to admixture the silver powder was ball milled for a time sufficient to obtain $-325$ mesh powder. 0.24 parts of benzopinacol were added to the admixture. The admixture was screen printed in a line circuit pattern through a 165 mesh stainless steel screen onto a Mylar substrate. The thus coated substrate was heat cured at 160° C. in an air oven for 10 minutes. The circuit had a resistivity of $2.32 \times 10^{-4}$ ohm-cm.

EXAMPLE 9

21.6 parts of Prepolymer B from Example 2 were admixed with 2.4 parts of pentaerythritol tetrakis($\beta$-mercaptopropionate), 0.216 parts of benzopinacol and 76 parts of silver powder, sold under the tradename "Silpowder-130". The silver powder had been treated as in Example 8 prior to admixture. The admixture was screen printed in a line circuit pattern through a 165 mesh stainless steel screen onto a Mylar substrate. The thus coated substrate was heat cured for 5 minutes at 160° C. in an air oven. The resultant circuit had a resistivity of $3.05 \times 10^{-1}$ ohm-cm.

EXAMPLE 10

23 parts by weight of Prepolymer B from Example 2 were admixed with 77 parts by weight of Type 123 nickel powder, commercially available from INCO Nickel, and 0.5 parts by weight of 1,1-di(t-butylperoxy)-3,3,5-trimethylcyclohexane, commercially available from Pennwalt under the tradename "Lupersol-231". The admixture was screen printed in a one circuit pattern through a 165 mesh stainless steel screen onto a Mylar substrate. After heat curing in an air oven at 160° C. for 10 minutes, the circuit had a resistivity of $2.60 \times 10^{-2}$ ohm-cm.

EXAMPLE 11

A heat curable organic resin composition was prepared by mixing the following components:

| Components | Parts by Weight |
| --- | --- |
| Prepolymer A from Example 1 | 37.75 |
| Triallyl cyanurate | 18.68 |
| Pentaerythritol tetrakis($\beta$-mercaptopropionate) | 41.52 |
| FC-430 (wetting agent - 3M Corp.) | 0.96 |
| Benzopinacol | 0.95 |
| Stabilizers | |
| Pyrogallol | 0.04 |
| Phosphorous acid | 0.008 |
| Triphenylphosphine | 0.01 |

The above formulation will be referred to hereinafter as heat curable Composition C.

EXAMPLE 12

24 parts by weight of heat curable Composition C from Example 11 were admixed with 76 parts by weight of silver coated glass beads said beads having a total of 8% silver by weight. The admixture was screen printed in a line circuit pattern until a Mylar substrate through a 165 mesh stainless steel screen. The coated substrate was cured for 10 minutes at 160° C. in an air oven. The resultant cured circuit had a resistivity of $5.06 \times 10^{-3}$ ohm-cm.

EXAMPLE 13

23 parts by weight of Prepolymer B from Example 2 were admixed with 77 parts by weight of Type 123 nickel powder, commercially available from INCO Nickel, and 0.023 parts by weight of azobisisobutyronitrile. The admixture was screen printed in a one circuit pattern through a 165 mesh stainless steel screen onto a Mylar substrate. After heat curing in an air oven at 160° C. for 10 minutes, the circuit had a resistivity of $2.06 \times 10^{-2}$ ohm-cm.

We claim:

1. A solventless screen printable, heat curable conductive ink composition comprising
(1) a member of the group consisting of
 (a) a polythiol in combination with a liquid, ethylenically, unsaturated monomer, oligomer or prepolymer of the formula:

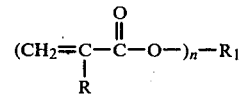

wherein R is H or $CH_3$, $R_1$ is an organic moiety and n is at least 2,
 (b) a polythiol in combination with a liquid ethylenically unsaturated monomer, oligomer or prepolymer of the formula:

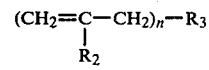

wherein $R_2$ is H or $CH_3$, $R_3$ is an organic moiety and n is at least 2, and
 (c) mixtures of (a) and (b);
(2) a thermal initiator; and
(3) a metal as an electrically conductive material in the range of 65-85 weight percent of the conductive ink composition.

2. The composition according to claim 1 wherein the group member is a liquid, ethylenically, unsaturated monomer, oligomer or prepolymer of the formula:

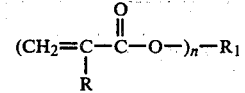

wherein R is H or $CH_3$, $R_1$ is an organic moiety and n is at least 2, and a polythiol.

3. The composition according to claim 1 wherein the group member is a polythiol in combination with a liquid ethylenically unsaturated monomer, oligomer or prepolymer of the formula:

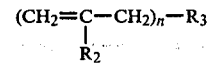

wherein $R_2$ is H or $CH_3$, $R_3$ is an organic moiety and n is at least 2.

4. The composition according to claim 1 wherein the composition contains a reactive diluent.

5. The composition according to claim 1 wherein the thermal initiator is a substituted or unsubstituted pinacol having the general formula:

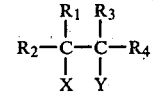

wherein $R_1$ and $R_3$ are the same or different substituted or unsubstituted aromatic radicals, $R_2$ and $R_4$ are substituted or unsubstituted aliphatic or aromatic radicals and X and Y which may be the same or different are hydroxyl, alkoxy or aryloxy.

6. The composition according to claim 1 wherein the thermal initiator is an organic peroxide of the general formula:

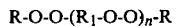

wherein n=0 or 1, R is independently selected from hydrogen, aryl, alkyl, aryl carbonyl, alkaryl carbonyl, aralkyl carbonyl and alkyl carbonyl and $R_1$ is alkyl or aryl, said alkyl groups containing 1 to 20 carbon atoms.

* * * * *